US007826501B2

(12) United States Patent
Stanley et al.

(10) Patent No.: US 7,826,501 B2
(45) Date of Patent: Nov. 2, 2010

(54) TUNABLE LASER (75) Inventors: Ross Stanley, Epalinges (CH); Maurizio Tormen, Corcelles (CH); Rino Kunz, Herrliberg (CH); Philippe Niedermann, Peseux (CH)

(73) Assignee: CSEM Centre Suisse d'Electronique et de Microtechnique SA Recherche et Developpement, Neuchatel (CH)

( * ) Notice: Subject to any disclaimer, the term of this patent is extended or adjusted under 35 U.S.C. 154(b) by 0 days.

(21) Appl. No.: 12/176,879

(22) Filed: Jul. 21, 2008

(65) Prior Publication Data
US 2009/0028194 A1  Jan. 29, 2009

Related U.S. Application Data (62) Division of application No. 12/161,640, filed as application No. PCT/EP2007/050605 on Jan. 22, 2007, application No. 12/161,640, which is a division of application No. PCT/EP2007/050605, filed on Jan. 22, 2007.

(30) Foreign Application Priority Data
Jan. 21, 2006 (EP) ................................. 06100690

(51) Int. Cl.
*H01S 3/10* (2006.01)
(52) U.S. Cl. ............................ 372/20; 372/99; 372/102; 359/290
(58) Field of Classification Search .................. 372/20, 372/23, 99–102; 359/1–34, 290–297
See application file for complete search history.

(56) References Cited

U.S. PATENT DOCUMENTS

| 6,643,065 B1 | 11/2003 | Silberman |
| 2003/0007523 A1 | 1/2003 | Chapman |

(Continued)

FOREIGN PATENT DOCUMENTS

| EP | 0 883 220 A | 12/1998 |
| WO | WO 99/48197 A | 9/1999 |
| WO | WO 03/098756 | 11/2003 |

OTHER PUBLICATIONS

International Search Report corresponding to PCT/EP2007/050605 filed Jan. 22, 2007.

(Continued)

*Primary Examiner*—Armando Rodriguez
*Assistant Examiner*—Xnning Niu
(74) *Attorney, Agent, or Firm*—Young & Thompson (57) ABSTRACT A mode hop-free tunable laser including a gain medium, a microfabricated blazed grating, defining an external cavity of a given length, the blazed grating lying in a general plane and including a plurality of elongate beams carrying mutually parallel respective reflection surfaces spaced apart from one another with a predefined pitch, and actuating elements designed so as to allow displacements of the assembly with respect to a grating support within a plane substantially parallel to the grating general plane, and including actuation elements designed so as to apply a stretching and a displacement of the assembly in a direction transverse to said reflection surfaces, the blazed grating being arranged relative to an incident light beam provided by the gain medium so that the incident light beam impinges on the reflection surfaces with a substantially normal incident angle.

7 Claims, 5 Drawing Sheets

U.S. PATENT DOCUMENTS

2003/0231692 A1  12/2003  Belikov
2004/0174583 A1*  9/2004  Chen et al. .................. 359/290
2004/0179268 A1  9/2004  Barbastathis
2005/0169325 A1*  8/2005  Schwarz et al. ............... 372/20

OTHER PUBLICATIONS

Shih et al., "MEMS tunable gratings with analog actuation", Information Sciences; vol. 149, No. 1-3, Jan. 2003; pp. 31-40, XP-002379440.

Yang et al., "Design and fabrication of pitch tunable blaze grating", Proceedings of SPIE, vol. 5717, pp. 99-107, XP-002379441.

Lee et al., "Single Crystal Silicon (SCS) XY-Stage Fabricated by DRIE and IR alignment", IEEE, 0-7803-5273-4, pp. 28-33.

Shieh et al., "A Tunable Dispersive Optical System", NSTI Nanotech 2005 Technical Proceedings, pp. 517-520, XP009065681.

Syms et al., "MOEMS Tuning Element for a Littrow External Cavity Laser", Journal of Microelectromechanical Systems, vol. 12, No. 6, Dec. 2003, XP-001200229.

* cited by examiner

TUNABLE LASER

CROSS-REFERENCES TO RELATED APPLICATIONS

The present application is a divisional of co-pending application Ser. No. 12/161,640, filed Jul. 21, 2008, which is the 35 U.S.C. 371 National Stage of international application no. PCT/EP2007/050605, filed Jan. 22, 2007, which claims priority to European application no. 06100690.4, filed Jan. 21, 2006. The present application is also a divisional of co-pending international application no. PCT/EP2007/050605, filed Jan. 22, 2007. The entire contents of the above-referenced applications are hereby incorporated by reference in their entirety.

TECHNICAL FIELD

The present invention relates to a blazed grating, in particular when it is microfabricated such as produced in MEMS (MicroElectroMechanical System) technology, to optical devices in which this grating is employed, more particularly to mode hop-free tunable lasers and to a process for fabricating gratings of this type.

More precisely, the grating according to the invention may lie in a general plane and comprise a plurality of elongate beams carrying mutually parallel respective reflection surfaces spaced apart from one another with a predefined pitch, each of these reflection surfaces having a normal direction inclined at a grating angle α to the normal direction of the general plane. Furthermore, the grating comprises a plurality of resilient suspension arms connected to the beams and intended to be fastened to a grating support. The suspension arms, the beams and their respective reflection surfaces define an assembly. First and second actuating elements may be provided for applying a first and a second mechanical forces to this assembly, these actuating elements being placed on a first and a second opposite sides of the grating, along an axis transverse to the beams.

PRIOR ART

Gratings of this type have already recently been produced. For example, the article entitled "Design and fabrication of pitch tunable blaze grating" by Yu-Sheng Yang and Cheng-hsien Liu, published in 2004 in the journal Proceedings of SPIE, Volume 5717, pages 99 to 107, describes a grating lying in a general plane, comprising a plurality of elongate beams, lying in the general plane of the grating, and a plurality of resilient suspension arms connected to the beams and intended to be fastened to a grating support. These beams bear mutually parallel respective reflection surfaces spaced apart by a predefined pitch from one another. Comb electrodes are arranged on either side of the beams so as to apply a mechanical force to them and to cause their relative displacement, in order to vary the pitch of the grating. In this way, the wavelength of a beam diffracted in reflection by this grating may then be adjusted.

However, for some applications, blazed gratings are preferred. Thus, this article provides for each of the reflection surfaces of the grating to be formed by an elongate part attached to the corresponding beam. The nature of the connection between this part and the beam allows the inclination of the normal direction of the reflection surface to be adjusted with respect to the general plane of the grating by means of additional electrodes, and therefore allows the grating to be configured so that it is a blazed grating.

Considering the order of magnitude of these structures, which are on the scale of a micron, it is apparent that the grating described in the abovementioned article is complicated to fabricate and to assemble. This makes it expensive and unsuitable for industrial exploitation.

Moreover, blazed gratings in which the beams and the reflective surfaces are produced from one part are also known, in which the angle of the grating is predefined and constant. In particular, each of the beams of these gratings may be controlled by two pairs of comb electrodes, each placed at its ends, so as to allow the assembly of beams to undergo an identical displacement simultaneously, that is to say for the complete grating in this case, in order to adjust the phase of a light beam diffracted in reflection.

However, here again the structure of the grating, with its large number of pairs of electrodes, is complicated to fabricate and assemble. Furthermore, it does not allow the pitch of the grating to be adjusted for the purpose of controlling the wavelength of the diffracted beam.

In general, processes for fabricating blazed gratings of the abovementioned type are known in the prior art. These known processes provide in particular for the reflection surfaces of the grating to be formed during a dry etching step. However, the roughness of the reflection surfaces thus obtained allows only a low level of optical efficiency to be achieved.

DISCLOSURE OF THE INVENTION

An object of the present invention is to alleviate the drawbacks of the abovementioned prior art by proposing a blazed grating that makes it possible in particular to adjust the wavelength of a diffracted beam while having a high efficiency in reflection, the fabrication and assembly of said grating being simple.

For this purpose, the invention relates to a grating of the abovementioned type, in which the assembly comprising the suspension arms, the beams and their respective reflection surfaces is preferably formed from a single part. Further, the actuating elements may be designed so as to allow

- the grating pitch to be modified in response to application of required first and second mechanical forces on the assembly, and/or
- a displacement of the whole assembly in response to an application of asymmetrical respective mechanical forces.

Thanks to these particular features, the grating is simple to fabricate and to assemble, while resulting in a small footprint. Moreover, it is less fragile than those gratings mentioned above in relation to the prior art, because of the mechanical design of the springs, and also it is more stable with respect to possible temperature changes. Further, the first and second actuating elements may be designed so as to be able to apply identical respective mechanical forces to the set of the beams in such a way as to allow the assembly to undergo displacement without stretching or deformation. Thanks to this, the grating may also allow the phase of a diffracted beam to be controlled independently of the adjustment of its wavelength.

The actuating elements may each comprise a pair of comb electrodes, each of these pairs being adjacent to an end beam of the grating.

Advantageously, the resilient arms connecting the beams pairwise may also have a particular structure, as it will appear from the rest of the description, in order to guarantee uniform transfer of the strains induced by the actuating elements.

The present invention also relates to devices in which the above grating is implemented, especially mode hop-free laser transmission devices or spectrometers.

BRIEF DESCRIPTION OF THE DRAWINGS

Other features and advantages of the present invention will become more clearly apparent on reading the following detailed description of exemplary embodiments of the present invention, with reference to the appended drawings given by way of non-limiting examples, in which.

EMBODIMENTS OF THE INVENTION

Figure 1:
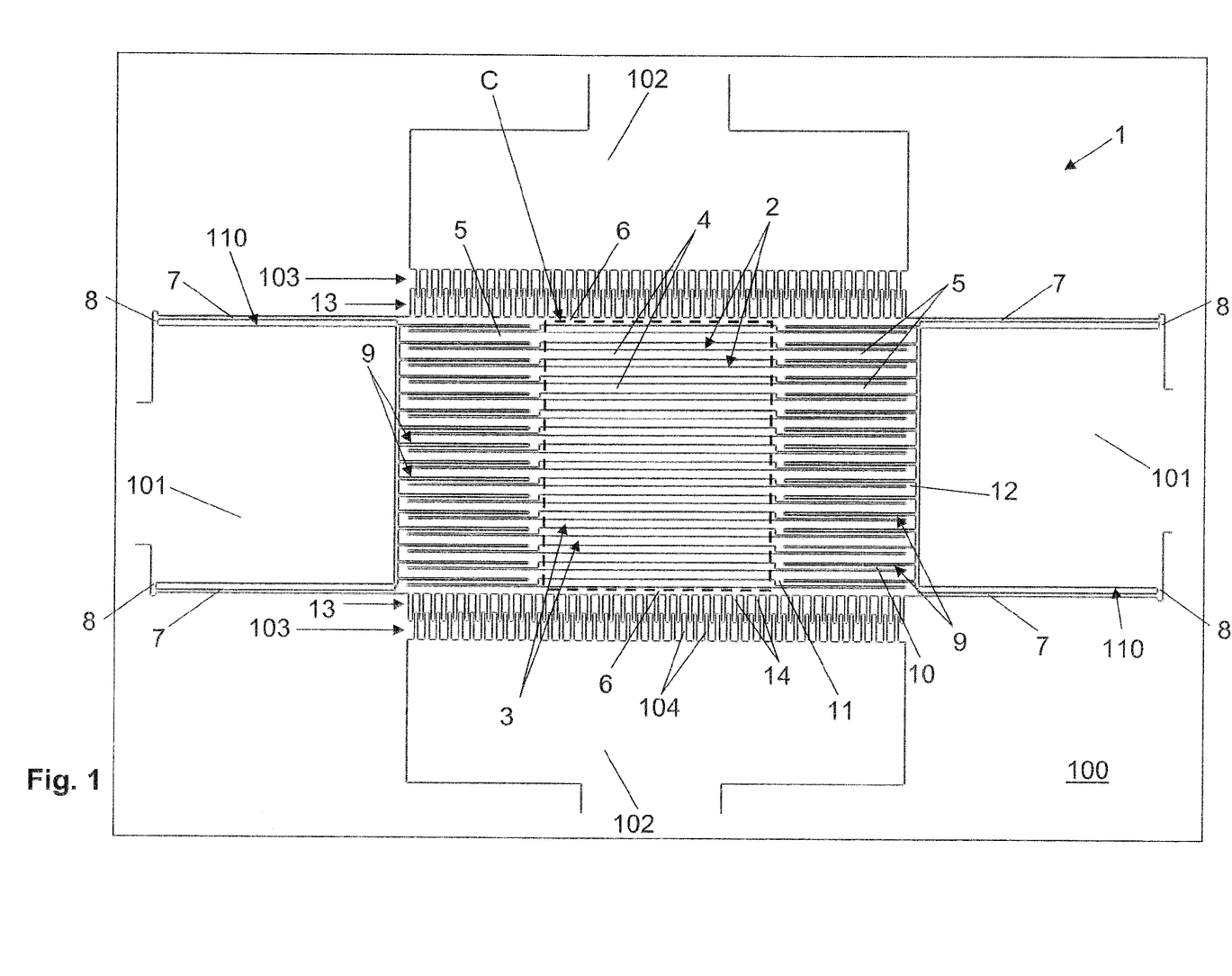
FIG. 1 shows a schematic top view of a blazed grating according to a preferred exemplary embodiment of the invention.

FIG. 1 shows a blazed grating 1, seen from above, according to a preferred exemplary embodiment of the invention.

This grating is of rectangular overall shape, defining a general plane, and comprises a plurality of parallel elongate beams 2, each bearing a reflection surface 3 that may be of substantially rectangular shape.

Each reflection surface 3 may be inclined in such a way that its normal makes an angle α to the normal direction of the general plane of the grating, as may be seen in the following drawings.

Each beam 2 comprises a central portion 4 bearing the corresponding reflection surface 3 and bounded on either side by lateral portions 5. The set of central portions 4 defines the optical grating as such, that is to say that part of the grating having optical properties making it suitable for use in an optical device, for example such as a laser. This part is indicated schematically by the rectangular frame C formed by the broken lines in FIG. 1.

The grating 1 is preferably produced by means of micromechanical techniques and is formed in a silicon wafer, such as that described later in relation to the description of FIG. 3a to FIG. 3i.

Thus, to give a non-limiting example, the grating 1 may be placed on a support 100 on which two support bases 101 and two control bases 102 may be made by having an additional thickness.

Each of the two end beams 6 of the grating may be extended by an elongate fastening arm 7 having smaller transverse dimensions than those of the beams 6. Each of the fastening arms 7 has an anchoring point 8 on a side wall 110 of the corresponding support base 101.

Moreover, two adjacent beams 2 (or 2 and 6) are connected together by means of a pair of resilient suspension arms 9 provided on either side of the central portions 4, that is to say in the lateral portions 5. Each suspension arm 9 may comprise an elongate main bar 10, preferably extending along a direction substantially parallel to the direction of the beams 2 and 6. Two short studs 11 and 12 may connect the first and second ends of the main bar to the beams that are located, respectively, on one side of the suspension arm in question and on the other.

According to the exemplary embodiment shown in FIG. 1, each end beam 6 carries an electrostatic comb electrode 13, the teeth 14 of which are interdigitated with the teeth 104 of a similar electrode 103, integral with the corresponding control base 102 to define an actuating element. This type of electrode is well known in the art and will not be described in greater detail in the rest of the text.

By supplying power to these electrodes 13, 103, it is possible to apply an electrostatic force to one or other electrode, this applying a mechanical force on the grating via the corresponding end beam 6.

Thus, supplying one of the electrodes 103 results in an elastic deformation or stretching of the grating. More precisely, a first assembly of the grating, subjected mainly to the induced mechanical force, comprises the beams 2 with their respective reflection surfaces 3 and the suspension arms 9. Advantageously, this grating assembly is produced from a single part, as will emerge from the detailed description of the fabrication process shown schematically in FIG. 3a to FIG. 3i. Thanks to this particular feature, the grating according to the present invention has a simple structure, resulting in inexpensive fabrication and assembly, making its industrial exploitation possible. Moreover, the thermal stability of the grating and its behaviour over time may also be improved compared with the devices of the prior art which comprise attached elements.

In addition, the architecture of the grating according to the invention, and especially of the abovementioned assembly, provides the additional advantage of uniform distribution of the mechanical force induced in the grating limiting the risks of distorting its shape.

Preferably, the fastening arm 7 and the electrodes 13 may also be produced from a part with the abovementioned assembly, to further improve the general mechanical behaviour of the grating and to simplify its fabrication.

As is known, the comb electrodes may be supplied in a controlled manner so as to adjust the stretching level of the grating. Thus, it is possible for the pitch of the grating to be precisely adjusted in order for the wavelength of a light beam diffracted in reflection by the grating to be precisely defined.

The embodiment in which one pair of electrodes is provided allows opposing mechanical forces to be applied to the entire grating. The latter thus undergoes a displacement without any deformation of its optically active part. Such a displacement, in relation to a given incident beam, gives rise to a change in the phase of the corresponding diffracted beam, without its wavelength being modified.

In this case, the mechanical forces giving rise to the displacement may be completely absorbed by the fastening arm 7 and the suspension arms 9 without being transferred to the central portions of the beams 2, thus guaranteeing structural stability of the beams 2 and therefore the optical properties of the diffracted light beam.

By suitably supplying the electrodes, it is advantageously possible to obtain a combination of a stretching and a displacement of the grating in order for the wavelength and the phase of the diffracted light beam to be adjusted simultaneously.

Figure 2:
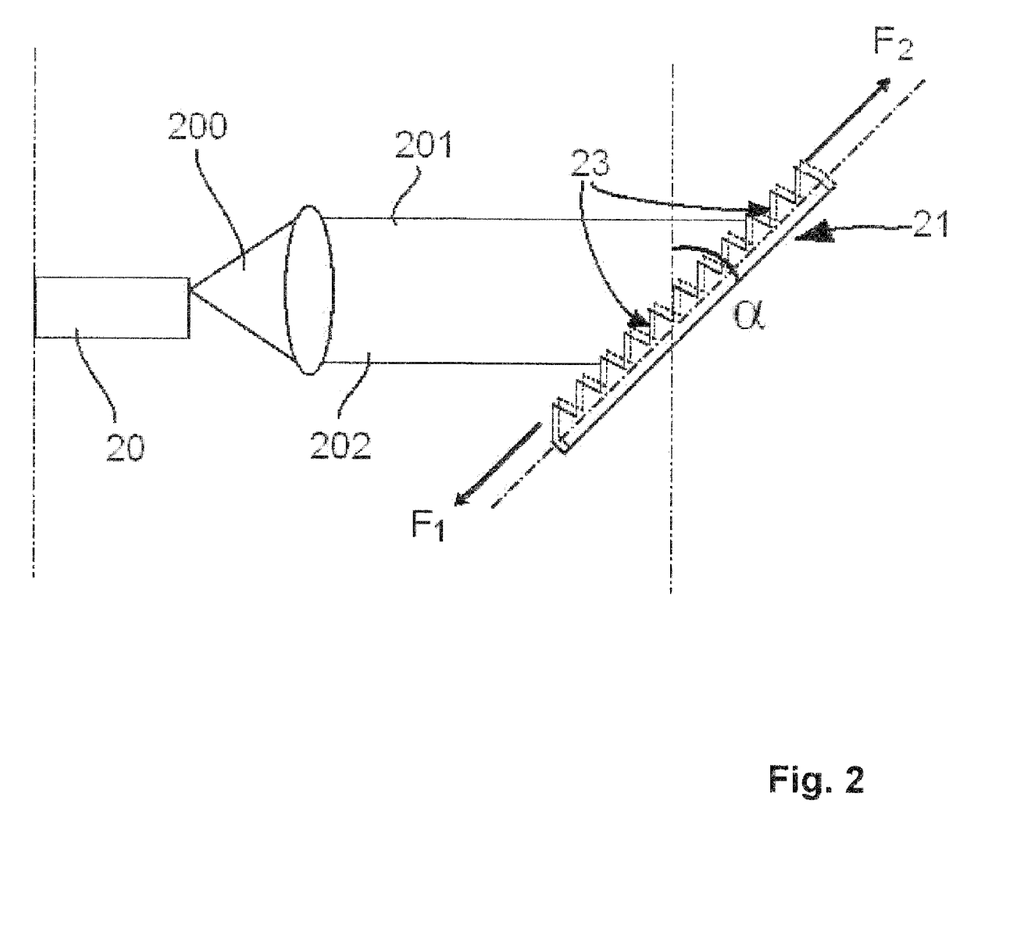
FIG. 2 is a schematic view showing the optical principle governing the operation of a grating according to the present invention in an optical device.

FIG. 2 shows, schematically, a use of the grating described above in a general optical device, which could in particular be a laser or a spectrometer, these examples being mentioned here without implying any limitation.

This drawing shows an optical radiation source 20 emitting a light beam 200, which passes through a focusing device so as to propagate towards a grating 21 and to define an approximately parallel incident beam 201. The incident beam is then reflected by the grating 21, generating a diffracted beam 202 along the same line as the incident beam but in the opposite direction.

In the particular case shown in FIG. 2, the grating 21 is placed in the optical device in such a way that the Littrow autocollimation condition is met, that is to say in such a way that the incident beam 201 is directed parallel to the normals of the reflection surfaces 23 of the grating. In other words, the incident beam makes an angle complementary to the angle α to the general plane of the grating. As is known, this device has the advantage of better optical efficiency in reflection, which especially explains its frequent use in laser sources, in particular in laser resonant cavities of the ECL (External Cavity Laser) type.

Advantageously, the grating 21, the pitch of which can be modified depending on the abovementioned conditions, in order to modify the wavelength of the diffracted beam, may also undergo a translational displacement relative to the incident beam so as to modify the phase of the diffracted beam.

The fact of limiting the displacements of the grating to translational movements, i.e. while keeping the grating parallel to its general plane direction when in the Littrow condition, allows the Littrow condition to be maintained and therefore to ensure good optical efficiency of the device. However, as will be seen later, it may also be desirable in some applications to generate other movements in order to vary the grating efficiency.

Provision may be made for the grating to be assembled on a support, such as the support 100 described in relation to the description of FIG. 1, said support comprising means suitable for moving it translationally in the field of the incident beam.

Preferably, the grating 21 is similar to the grating 1 described above and its reflection surfaces may undergo direct translational displacement relative to the support (not shown in FIG. 2) of the grating. Such displacements are shown schematically by the dot-dashed lines in FIG. 2, arrows $F_1$ and $F_2$ schematically indicating first and second mechanical forces which may be applied by the first and second actuating elements 13, 103, respectively. Depending on their values and directions, these mechanical forces, in combination, may give rise to a pure stretching, to a pure displacement or to both a stretching and a displacement.

Considering that $F_1$ and $F_2$ generate two respective displacements of the grating assembly $d_1$ and $d_2$, leading to an in-plane grating stretching and an in-plane grating rigid displacement at the same time, we can note that the stretching may be given by $\Delta s = d_1 + d_2$ and
the displacement may be given by $$\Delta d = \frac{d_1 - d_2}{2}.$$

Moreover, the fact that a means of applying translational movements to the grating 1 may be coincident with its means of stretching, in the form of pairs of electrodes placed on either side of the beams of the grating, the resulting optical device may be produced in a very compact form.

Of course, a control device, including suitable electronic control units for example, may be provided for controlling the supply for the displacement application means and/or stretching application means. Such control means are known in the art and will not be described further in greater detail.

Thanks to these features, in particular the possibility of adjusting the wavelength and the phase of the diffracted beam independently and without modifying the angle between the grating and the incident beam, the present invention makes it possible to use external cavity lasers that can be tuned in a mode hop-free fashion, that is to say in a continuous fashion.

Indeed, a tunable mode hop-free laser may be implemented with a microfabricated grating as previously described arranged within the housing defining an external cavity so as to play the role of an external cavity mirror. The grating could preferably be arranged with an angle such that an incident light beam provided by a laser source would impinge substantially in a normal direction on the reflection surfaces of the grating, ensuring thus that the Littrow condition is met. As previously explained, the grating actuating elements allow a fine tuning of the wavelength of a diffracted beam by uniform modification of the grating pitch. Further, the fact that the actuating elements also allow a controlled displacement of the grating assembly offer an adjustment possibility of the external cavity length, and doing so, of the diffracted beam phase. These two independent actuating options allow a tuning of the laser wavelength in a mode hop-free fashion, which is particularly advantageous in some fields of applications such as telecommunications.

It is to be noted that the grating displacements may be either in-plane or out-of-plane displacements without going beyond the scope of the present invention. Also, the incident angle of the incident light beam on the reflection surfaces may be slightly different from 0 relative to the reflection surface normal direction, i.e. within a range going substantially from −15 degrees to +15 degrees, preferably from −5 degrees to +5 degrees, the grating efficiency being then slightly lower than in the normal direction.

Furthermore, these features also make it possible to construct a spectrometer offering both the functionalities of a Fourier-transform spectrometer, by adjustment of the phase, namely one having a wide range of accessible wavelengths, and of a grating spectrometer, by adjustment of the pitch of the grating, namely one having good precision in selecting the working wavelength.

FIG. 3a to FIG. 3i show schematically, in cross section, the main steps of a process for fabricating the grating described above, according to a preferred embodiment.

Figure 3A:
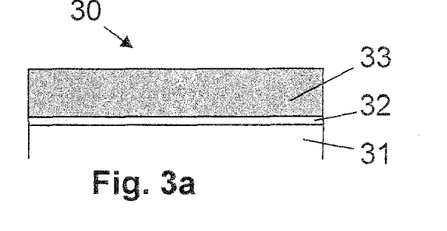
FIG. 3a to FIG. 3i show, schematically, the various steps of a process for fabricating the grating of FIG. 1 according to a preferred embodiment.

This fabrication process is implemented on the base of an SOI (Silicon On Insulator) substrate 30, visible in FIG. 3a, comprising a silicon lower layer 31 surmounted by a silicon oxide buried layer 32, itself surmounted by a silicon upper layer 33.

The process comprises a step consisting in carrying out a dry etching down to the silicon oxide layer, in order to form trenches 35.

Figure 3B:
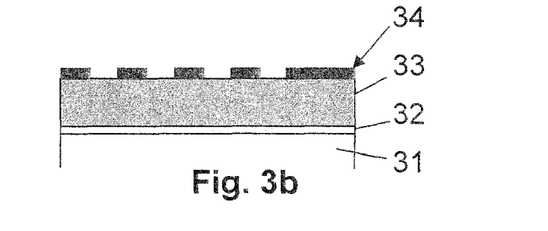
Figure 3C:
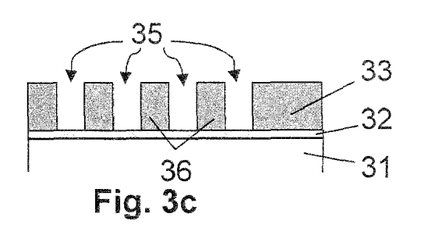
Figure 3D:
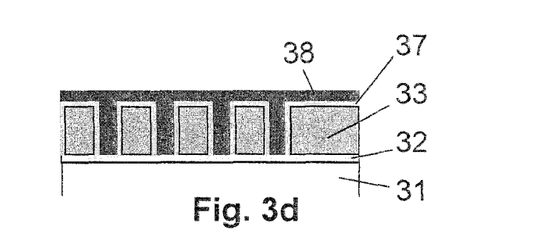
Figure 3E:
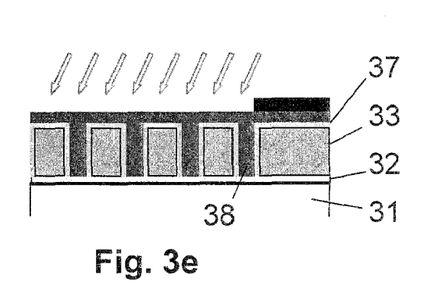

This first step may be implemented through a first photolithography operation in order to define a first protective mask 34 (FIG. 3b) before the silicon upper layer is dry-etched, preferably by deep reactive ion etching, down to the silicon oxide layer, in order to form trenches 35 (shown in FIG. 3c).

The trenches 35 define parallel beams 36 and arms connecting these beams pairwise, only the section of the beams being visible in FIG. 3c.

A lithography operation may be carried out then so as to obtain an asymmetric protection of only one of the two sides of each beam along a direction perpendicular to the beam direction.

For that purpose, the above-mentioned first protective mask may be removed and a surface thermal oxidation 37 of the silicon upper layer 33 may be carried out. A protective resist 38 may then be deposited on the silicon oxide surface layer 37 and down to the bottom of the trenches 35, as may be seen in FIG. 3d, before a second photolithography step (shown schematically in FIG. 3e) is carried out. This is carried out, unusually, by irradiating the protective resist at a non-zero angle of incidence to the normal direction of the upper surface of the substrate. Arrows, indicated by I in FIG. 3e, indicate the inclined direction of the irradiation used in this step.

Figure 3F:
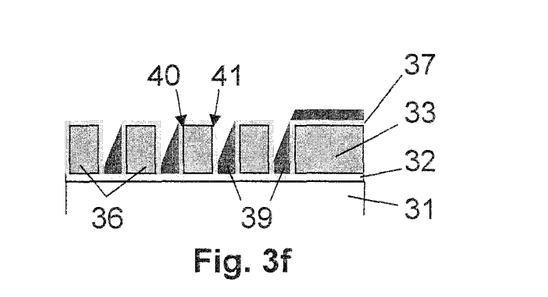

This particular feature makes it possible to define a second protective mask 39, which may protect that part of the silicon oxide surface layer 37 which covers a sidewall 40 of each of the trenches 35 adjacent to a beam 36. The remaining part of the surface oxide layer, i.e. that covering the other sidewall 41 of each trench, may be at least partly exposed, as shown in FIG. 3f. The exposed sidewall 41 of each beam 36 is intended to allow the formation of a reflection surface 42. For this purpose, a chemical or plasma etching, more particularly an acid etching, is carried out in order to remove the surface silicon oxide covering the exposed part of the sidewall, the result corresponding to the representation shown in FIG. 3g.

It should be pointed out that a part 43 of the silicon upper layer 33 is preferably protected during formation of the reflection surfaces 42, in order to maintain its shape as defined during the formation of the trenches. This part 43 may be any constituent element of the grating as described in relation to FIG. 1 other than the beams 2 or the arms 7, 9, i.e. a portion of a control base 102 or a support base 101, or else an end beam 6.

The silicon of the upper layer 33 is thus directly exposed and may be etched by an anisotropic chemical etching of the upper silicon layer, such as a basic etching, preferably using potassium hydroxide, so as to form an inclined reflection surface 42 on each of the beams 36. This type of etching makes it possible to obtain a silicon surface finish that guarantees high optical efficiency of the resulting reflection surfaces, in so far as such etching generates, in a known manner, reflection surfaces that are parallel to the {111} crystallographic planes of silicon. The second protective mask 39 is then removed, as shown in FIG. 3h.

Finally, acid vapour etching is carried out in order to remove at least the silicon oxide portions 32 and 37 located around the beams and the arms (not visible), with the exception of the predefined anchoring zones (not visible) intended for suspending the grating on the substrate. The anchoring zones correspond to the anchoring points 8 for the fastening arms 7 described in relation to FIG. 1. The result of this step may be seen in FIG. 3i.

According to a preferred method of implementing the process that has just been described, the SOI wafer in which the grating is formed has a low resistivity, a silicon oxide buried layer, the thickness of which is around 2 μm and a $p^{++}$-doped silicon upper layer, the thickness of which is around 10 μm. The dimensions of this order of magnitude ensure that the resulting structure is sufficiently rigid, especially during the acid vapour etching step intended to remove the silicon oxide, in order to suspend the grating. Preferably, the SOI wafer may be oriented along the {001} crystallographic planes of silicon.

The photolithography and deep reactive ion etching steps described in relation to FIG. 3b and FIG. 3c must be carried out with maximum precision because this has a direct influence on the uniformity of the mechanical properties of the grating finally obtained. These two operations have in particular an obvious impact on the reproducibility of the elastic properties of the suspension arms and on the relative positioning of the grating beams.

According to an advantageous alternative method of implementation, the electrodes, the fastening arms, the support bases and the control bases are also formed during these two operations.

Figure 3G:
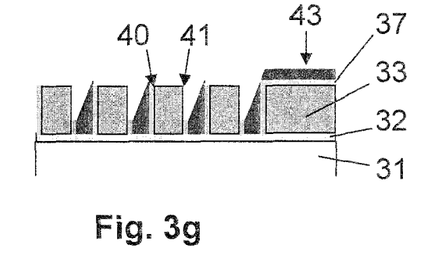
Figure 3H:
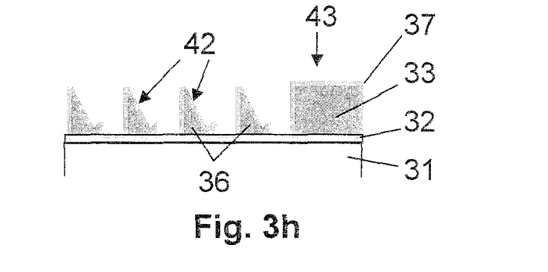

The acid etching resulting in the structure shown in FIG. 3g is preferably wet etching, for example by using an HF (hydrofluoric acid) buffer solution. The final, acid vapour etching, step may also be carried out with HF.

Optionally, it is possible to provide a subsequent step of depositing metal, especially gold, in order to ensure high optical efficiency in reflection over a wide wavelength spectrum.

Figure 3I:
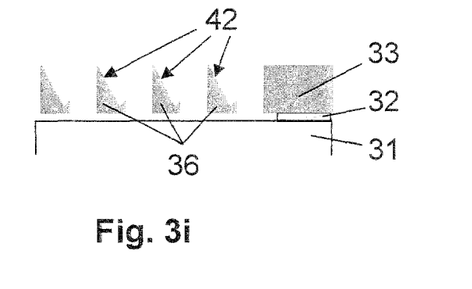

Residual silicon rims 45 may be seen, in FIG. 3h and FIG. 3i, at that end of each reflection surface 42 closest to the substrate 31. The presence of these rims is explained by the angle of incidence of the irradiation in the photolithography second step, considered here in relation to the dimensions of the beams 36 and of the trenches 35. Since each of these rims 45 is masked during this step by an edge 46 of the adjacent beam 36 in the example shown, the corresponding silicon oxide is not etched. This prevents the silicon from being etched by the potassium hydroxide in the subsequent step. Of course, depending on the dimensions adopted for the various constituent entities of the grating and the angle of incidence of the irradiation in the photolithography second step, these rims may be eliminated. Moreover, it may be noted that the angle of incidence of the irradiation in this step corresponds substantially to the angle of incidence of a light beam on the reflection surfaces when the grating is used so as to meet the Littrow condition. Consequently, in this condition, the rims do not form part of the optically active portion of the reflection surfaces, because they are again masked by the adjacent beam and do not constitute a problem when the corresponding grating is used.

Referring back to the applications of the grating according to the present invention, more specifically in the field of lasers, it may be desirable to be able to vary the grating optical efficiency, what may be done through different ways.

Figure 4A:
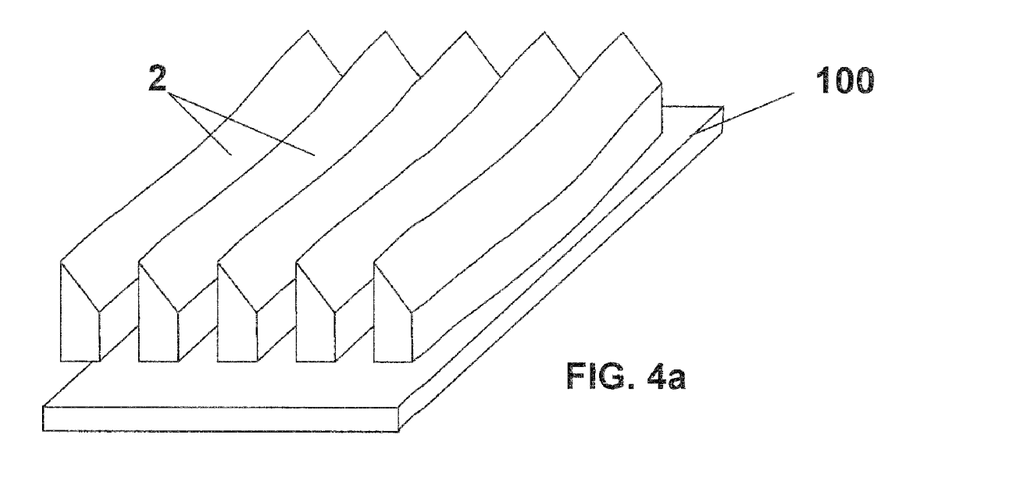
FIG. 4a, FIG. 4b and FIG. 4c show, schematically, further exemplary ways of implementing the grating according to the invention.
Figure 4B:
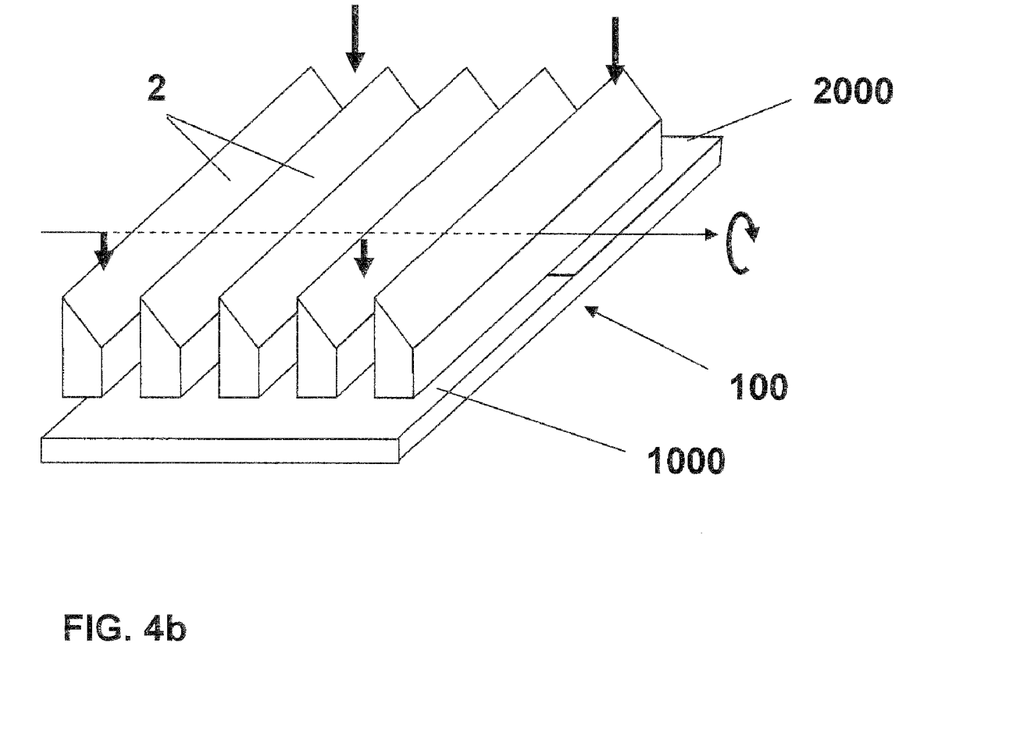
Figure 4C:
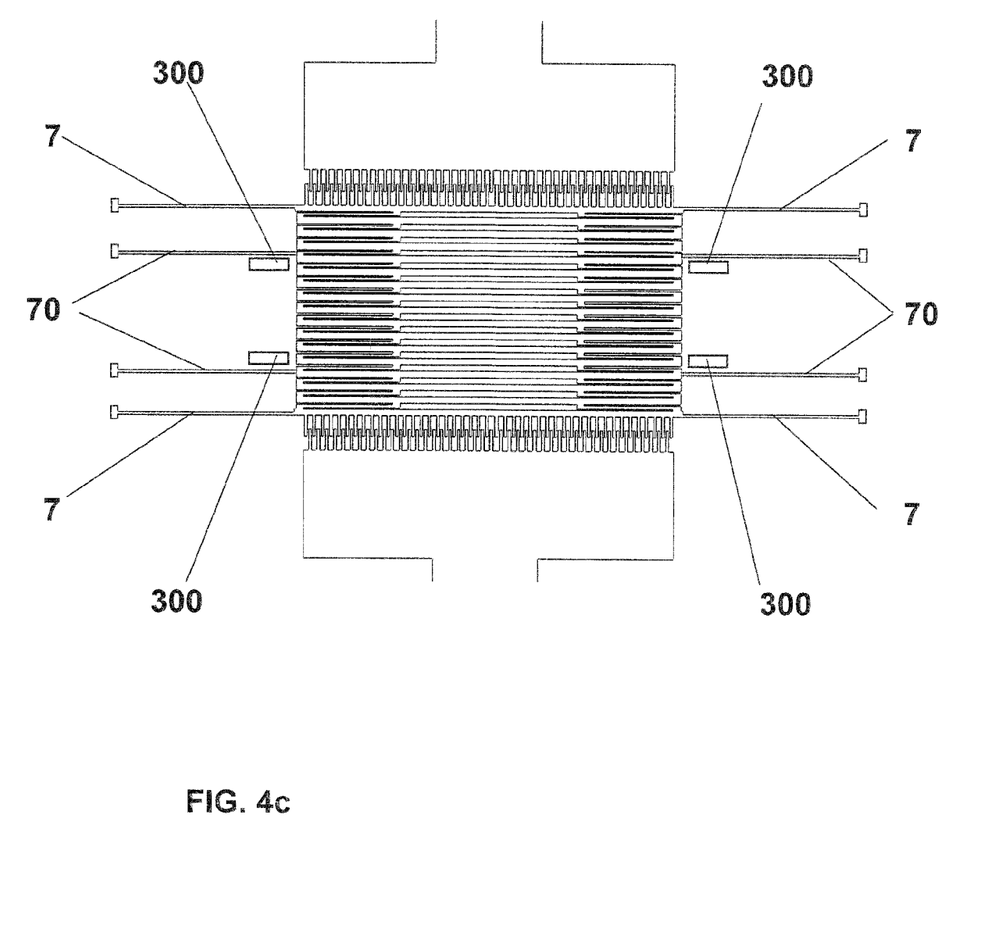

FIG. 4a to FIG. 4c schematically show several exemplary embodiments allowing to control the grating efficiency. For a purpose of clarity, only details of grating beams 2 and of grating support 100 are represented on FIG. 4a and on FIG. 4b.

FIG. 4a illustrates how beams 2 may be deformed so that optimal reflection efficiency may not be reached. In the preceding description, the respective electrical potentials of the beams and of the grating support were implicitly supposed to be equal. Thus, application of different electrical potentials to beams 2, on the one side, and to grating support 100, on the other side, generates a shape distortion of the beams by electrostatic attraction, which appears from this drawing. Rising of the distortion leads to a lowering of the optical efficiency of the grating.

FIG. 4b illustrates an alternate embodiment of the grating in which grating support 100 comprises two adjacent parts 1000 and 2000 along a direction perpendicular to that of the beams. Parts 1000 and 2000 are preferably insulated from each other from the electrical point of view. Thus, by application of different electrical potentials on parts 1000 and 2000, the latter show different behaviour with respect to beams 2. As illustrated on the example of FIG. 4b, part 2000 could generate a stronger attraction force on beams 2 than part 1000, giving rise to a tilting of beams 2 according to the represented circular arrow. This tilting leads to a lowering of the optical efficiency of the grating.

FIG. 4c represents, in a schematic top view, an alternate exemplary embodiment of the grating according to the present invention.

In this embodiment, two additional pairs of fastening arms 70 are provided at a distance from comb electrodes 13, as well as two additional pairs of actuators 300, located adjacent to the additional fastening arms.

Provision of these additional elements defines three different regions of the grating assembly, i.e., starting from one side, a first region between a first pair of fastening arms 7 connected to end beams 6 and a first additional pair of fastening arms 70, a second region between the two additional pairs of fastening arms 70 and a third region between the second additional pair of fastening arms 70 and the second pair of fastening arms 7 connected to opposite end beams 6.

Thanks to this structure, the grating may be provided with different pitch values along the direction perpendicular to the beams as a function of the mechanical forces generated by each of the actuating elements 13, 103, 300. In case the grating presents different pitch values, a diffracted light beam will be composed of several wavelengths, thus with a broader bandwidth. As a consequence, the efficiency for a given wavelength will be lowered with respect to its value in connection with a grating of constant pitch, i.e. with a narrow bandwidth.

The above description corresponds to a preferred embodiment of the invention described by way of non-limiting example. In particular, the shapes shown and described for the various constituent elements of the grating are not limiting. More precisely, the main bars 10 of the arms 9 may be formed by making them slightly curved without thereby departing from the scope of the invention.

Comb electrodes are preferred as they allow the behaviour of the grating to be controlled both precisely and rapidly. However, a person skilled in the art may consider employing different grating control means without departing from the scope of the present invention, such as for example piezoelectric electrodes or thermal actuation means.

Given below is a list of applications in which the use of the grating described is advantageous: in the field of spectrometry, particularly in spectrometers that require the wavelength and the phase of the measurement beam to be parameterized independently; in the field of tunable lasers, in particular when it is preferable to be able to tune the wavelength and/or the phase of the beam continuously; and in the use of devices comprising multiple detectors arranged in matrix form, such as for example spectrometers, in particular those for which the question of overall size is important. Of course, this list is not exhaustive—has been provided by way of indication.

What is claimed is:

1. A mode hop-free tunable laser comprising:
   a gain medium,
   a control device,
   a microfabricated blazed grating, defining an external cavity of a given length,
   said blazed grating lying in a general plane and comprising:
      a plurality of elongate beams carrying mutually parallel respective reflection surfaces spaced apart from one another with a predefined pitch, each of said reflection surfaces having a normal direction inclined at an angle α to the normal direction of said general plane, said beams defining an assembly the position of which defines said cavity length; said reflection surfaces being substantially normal to the incident light beam provided by the gain medium;
   and
      actuating elements designed so as to apply, with possibly asymmetrical forces to the grating extremities, a stretching and a displacement of said assembly within a plane substantially parallel to said grating general plane, said actuating elements being a first and a second pairs of comb electrodes, one end of which being fastened to said assembly and the other end being fastened to said grating support
   said control device being designed to possibly act on said actuating elements, so as to enable:
      a uniform modification of said pitch in order to adjust the wavelength of a light beam diffracted by said grating; and
      a control of said cavity length so as to allow the phase of the light beam diffracted by said grating to be adjusted independently of said adjustment of its wavelength leading to a mode hop-free tuning of the tunable laser.

2. The tunable laser according to claim 1, wherein said incident light beam impinges on said reflection surfaces with an incident angle included within a range going substantially from −15 degrees to +15 degrees, preferably from −5 degrees to +5 degrees.

3. The tunable laser according to claim 1, wherein said actuating elements are designed so as to allow translation displacements of said grating out of its general plane.

4. The tunable laser according to claim 2, wherein said actuating elements are designed so as to allow translation displacements of said grating out of its general plane.

5. The tunable laser according to claim 1, wherein said actuating elements are further designed so as to allow generation of a controlled distortion of said assembly in order to vary said grating efficiency.

6. The tunable laser according to claim 2, wherein said actuating elements are further designed so as to allow generation of a controlled distortion of said assembly in order to vary said grating efficiency.

7. A mode hop-free tunable laser comprising:
   a gain medium,
   a microfabricated blazed grating, defining an external cavity of a given length,
   said blazed grating lying in a general plane and comprising:
      a plurality of elongate beams carrying mutually parallel respective reflection surfaces spaced apart from one another with a predefined pitch, each of said reflection surfaces having a normal direction inclined at an angle α to the normal direction of said general plane, said beams defining an assembly the position of which defines said cavity length; and
      actuating elements designed so as to allow displacements of said assembly with respect to a grating support within a plane substantially parallel to said grating general plane, and comprising actuation means designed so as to apply, with possibly asymmetrical forces to the grating extremities, a stretching and a displacement of said assembly in a direction transverse to said reflection surfaces,
   said blazed grating being arranged relative to an incident light beam provided by the gain medium so that said incident light beam impinges on said reflection surfaces with a substantially normal incident angle, said tunable laser further comprising a control device being designed to possibly act on said actuation means for applying a mechanical force, so as to enable:
      a uniform modification of said pitch in order to adjust the wavelength of a light beam diffracted by said grating; and
      a control of said cavity length so as to allow the phase of the light beam diffracted by said grating to be adjusted independently of said adjustment of its wavelength leading to a mode hop-free tuning of the tunable laser,
   wherein said actuating elements are further designed so as to allow generation of a controlled distortion of said assembly in order to vary said grating efficiency.

* * * * *